United States Patent
Kannengiesser

(10) Patent No.: US 9,905,991 B2
(45) Date of Patent: Feb. 27, 2018

(54) OPTICALLY PUMPED SEMICONDUCTOR LASER WITH MODE TRACKING

(71) Applicant: Coherent LaserSystems GmbH & Co. KG, Göttingen (DE)

(72) Inventor: Christian Kannengiesser, Lübeck (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 1056 days.

(21) Appl. No.: 14/462,356

(22) Filed: Aug. 18, 2014

(65) Prior Publication Data

US 2017/0244214 A1 Aug. 24, 2017

(51) Int. Cl.
| | |
|---|---|
| H01S 3/109 | (2006.01) |
| H01S 3/091 | (2006.01) |
| H01S 3/102 | (2006.01) |
| H01S 3/10 | (2006.01) |
| H01S 3/16 | (2006.01) |
| H01S 3/13 | (2006.01) |

(52) U.S. Cl.
CPC .............. *H01S 3/109* (2013.01); *H01S 3/091* (2013.01); *H01S 3/1028* (2013.01); *H01S 3/10061* (2013.01); *H01S 3/1305* (2013.01); *H01S 3/1628* (2013.01)

(58) Field of Classification Search
CPC ...... H01S 3/109; H01S 3/1305; H01S 3/1628; H01S 3/1028; H01S 3/091
See application file for complete search history.

(56) References Cited

U.S. PATENT DOCUMENTS

| | | |
|---|---|---|
| 5,164,947 A | 11/1992 | Lukas et al. |
| 5,263,038 A | 11/1993 | Lukas et al. |
| 6,097,742 A | 8/2000 | Caprara et al. |
| 2006/0056470 A1* | 3/2006 | Liu .......................... H01S 3/13 372/38.1 |
| 2014/0092926 A1* | 4/2014 | Seelert .................. H01S 3/0014 372/22 |

OTHER PUBLICATIONS

International Search Report and Written Opinion received for PCT Patent Application No. PCT/EP2015/067078, dated Nov. 10, 2015, 12 pages.

(Continued)

*Primary Examiner* — Dung Nguyen
(74) *Attorney, Agent, or Firm* — Morrison & Foerster LLP

(57) ABSTRACT

An intra-cavity doubled OPS-laser has a laser-resonator including a birefringent filter (BRF) for coarse wavelength-selection, and an optically nonlinear (ONL) crystal arranged for type-II frequency-doubling and fine wavelength-selection. Laser-radiation circulates in the laser-resonator at one of a range of fundamental wavelengths dependent on the resonator length. The ONL crystal has a transmission peak-wavelength dependent on the crystal temperature. Reflection of circulating radiation from the BRF is monitored. The reflection is at a minimum when the ONL crystal transmission-peak wavelength is at the circulating radiation wavelength. The temperature of the ONL crystal is selectively varied to maintain the monitored reflection at about a minimum.

7 Claims, 4 Drawing Sheets

(56) References Cited

OTHER PUBLICATIONS

Kannengiesser et al., "Ultra-Narrow Bandwidth, OPS Laser in the Green-Yellow Wavelength Range for Raman-Spectroscopy", Proc. of the Spie., vol. 7193, 2009, pp. 71931A-1-71931A-8.
Gardner et al., "A Birefringent Etalon as Single-Mode Selector in a Laser Cavity", Optics Express, vol. 12, No. 11, May 2004, pp. 2365-2370.
Von Elm et al., "Unpublished U.S. Appl. No. 14/210,433, filed Mar. 13, 2014, titled "Vibration Resistant Optically Pumped Semiconductor Laser"", 6 pages.

* cited by examiner

OPTICALLY PUMPED SEMICONDUCTOR LASER WITH MODE TRACKING

TECHNICAL FIELD OF THE INVENTION

The present invention relates in general to external cavity optically pumped semiconductor (OPS) lasers. The invention relates in particular to intra-cavity frequency converted OPS lasers operating in a single longitudinal mode.

DISCUSSION OF BACKGROUND ART

Intra-cavity frequency converted (frequency doubled) OPS-lasers can provide several Watts (W) of continuous wave (CW) radiation output at visible (green) wavelengths while operating in a single longitudinal mode. The green, single-mode output wavelength can be converted to a wavelength in the ultraviolet (UV) region of the electromagnetic spectrum by further frequency multiplication in an optically non-linear crystal outside the OPS laser cavity (laser-resonator).

By way of example, an OPS-laser having a fundamental lasing wavelength of about 1064 nanometers (nm) can be frequency-doubled by an intra-cavity optically nonlinear crystal to provide output radiation having a wavelength of about 532 nm. That output radiation can be converted to UV radiation having a wavelength of about 266 nm by frequency-doubling the output radiation in an optically non-linear crystal located outside the OPS laser-resonator.

OPS lasers employ a multilayer semiconductor structure as a gain-element (gain structure). The gain-structure includes quantum-well (QW) layers spaced apart by spacer layers. The spacer layers absorb optical pump radiation thereby producing electron-hole pairs. The electron-hole pairs fall into, and are confined by, the QW layers. Recombination of electron-hole pairs in the QW layers provides radiation in a fundamental wavelength range characteristic of the QW material of the QW layers. This provides optical gain. The wavelength range in which radiation is produced is referred to as the gain-bandwidth.

The QW layers of the gain-structure are spaced apart by one-half wavelength at the peak gain-wavelength of the gain-bandwidth. In an OPS-structure (OPS-chip), the gain-structure surmounts a mirror-structure. Typically an OPS-laser resonator is configured with the mirror of the OPS-chip providing one end-mirror of the resonator. If the resonator is configured to avoid supporting lateral oscillation modes (transverse modes), placement of the gain-structure at an end of the resonator together with the half-wave periodicity of gain provided by the spaced-apart QW layers provides that the OPS-laser will generate CW radiation in a single longitudinal mode (single-frequency), at any given instant. A discussion of the significance of the statement "at any given instant" is set forth below.

The gain-bandwidth of an OPS gain-structure is relatively very broad. By way of example, for a peak-gain wavelength of about 1000 nm, the FWHM gain bandwidth is on the order of 40 nm. In an intra-cavity frequency doubled OPS-laser it is usual to include a single element birefringent filter in the cavity. This restricts the range of fundamental wavelengths that can oscillate to a range within a phase-matching acceptance bandwidth for the optically nonlinear crystal. The birefringent filter is arranged for Brewster angle incidence, which establishes the polarization-orientation of the circulating radiation generated in the resonator.

Unfortunately, the pass-bandwidth of such a birefringent filter is still sufficiently broad that in a resonator having a length of about 70 millimeters (mm) there may be several possible oscillating modes (frequencies). A result of this is that, while only one of these modes oscillates at any given instant, any perturbation of the resonator can result in oscillation changing from one possible mode to an adjacent possible mode. This phenomenon is usually referred to by practitioners of the art as "mode hopping". At the instant of the mode hop there is an abrupt (essentially instantaneous) change in output power followed by a brief period of instability. This instability period will be on the order of a few hundredths of a second. This constitutes effectively an interruption of the CW output of the OPS-laser. If an actively controlled external enhancement resonator is used for further frequency-conversion of the OPS-laser output, there will be an abrupt drop in output-power from that resonator, and a recovery period during which the enhancement resonator establishes resonance for the new output-frequency of the laser. This will be longer than the instability period for the laser output power.

FIG. 1 is a reproduction of an oscilloscope trace of monitored output-power of an intra-cavity frequency-doubled OPS laser that has been perturbed by increasing output power from 90% to 110% of a nominal optimum output-power. The power increase is initiated at point A. The laser operates at the increased power for about 3.5 seconds then mode-hop occurs at point B, at which output is interrupted. Output-power resumes at a higher level due to stored energy in the gain-structure during the interruption. The period of instability following the interruption is about 1.5 seconds.

In applications such as inspection of semiconductor wafers such an interruption of the CW process may be intolerable, even if the wavelength change due to the mode-hop is tolerable. There is a need for an OPS laser-resonator that can operate without mode-hopping.

SUMMARY OF THE INVENTION

One aspect of a laser apparatus in accordance with the present invention comprises a laser resonator including a multilayer semiconductor gain-structure, the gain-structure having a gain-bandwidth. The semi-conductor gain structure is included in the laser resonator. The gain-structure is energized by optical pump radiation, thereby causing fundamental-frequency radiation to circulate in the laser resonator. The fundamental frequency is one of a range of possible oscillating frequencies dependent on an instant length of the laser-resonator. An optically nonlinear crystal is located in the laser-resonator and arranged for type-II frequency doubling of the circulating fundamental-frequency radiation. The optically nonlinear crystal has an acceptance bandwidth in a predetermined temperature range. A heating element is arranged to selectively vary the temperature of the crystal within the predetermined temperature range. A first birefringent filter is located in the laser resonator, configured and arranged to restrict the range of possible fundamental frequencies that can oscillate within the gain-bandwidth to a range thereof within the acceptance bandwidth of the optically nonlinear crystal. A detector is arranged to monitor fundamental-frequency radiation reflected from the birefringent filter, the reflected radiation being at a minimum when a transmission peak of a second birefringent filter is at an instant one of the possible oscillating frequencies. The optically nonlinear crystal functions as a second birefringent filter having a transmission peak dependent on the crystal temperature. The heating element is cooperative with the detector for maintaining the monitored reflection at a minimum, thereby maintaining the transmission peak of the second birefringent filter at the instant oscillating frequency.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 2:
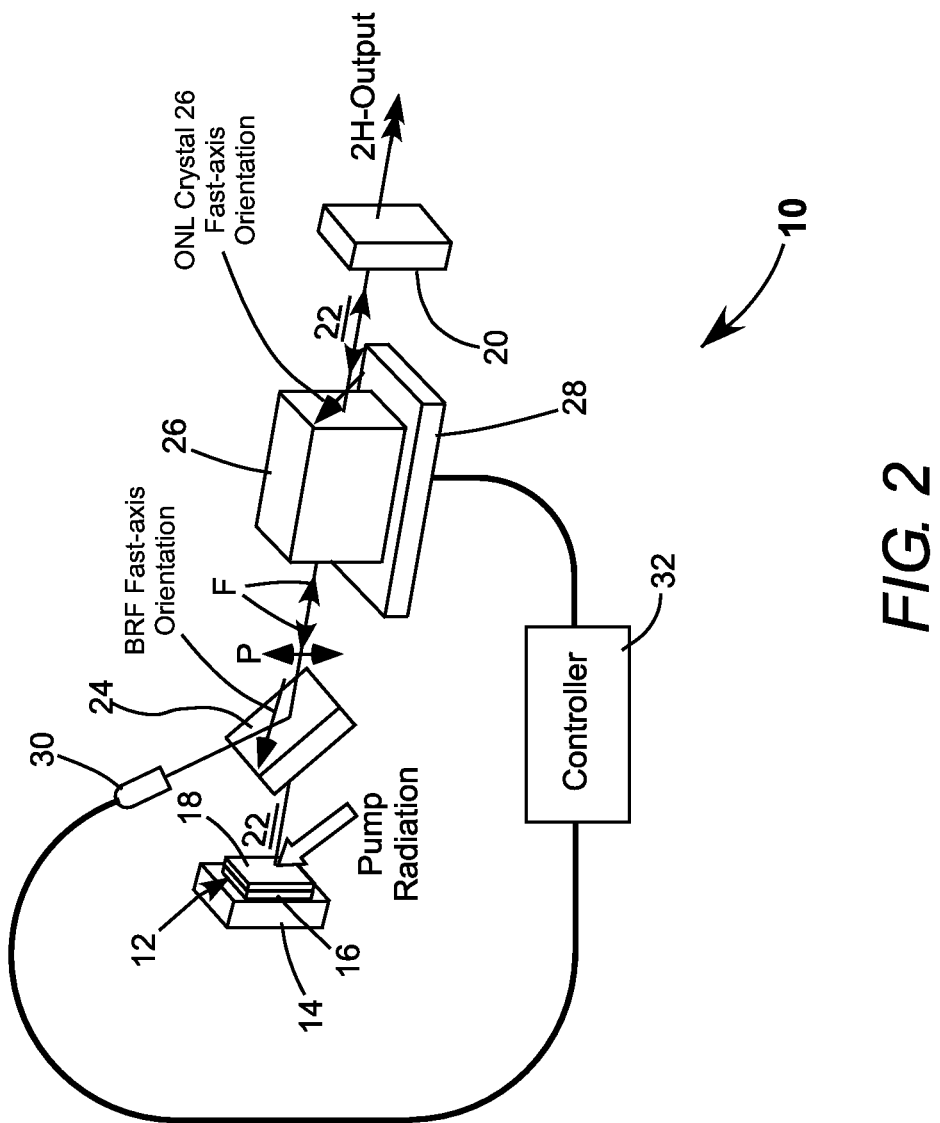
FIG. 2 schematically illustrates an intra-cavity frequency doubled OPS laser in accordance with the present invention, the laser having a laser resonator including an OPS gain-structure and having fundamental-wavelength laser-radiation circulating therein, the resonator including an optically nonlinear crystal arranged for type-II second harmonic conversion of the circulating radiation, a birefringent filter cooperative with the optically nonlinear crystal for selecting a laser operating mode from the gain-bandwidth of the gain structure, a detector for measuring fundamental wavelength radiation and a heating element responsive to the measured reflected fundamental wavelength for temperature tuning the optically nonlinear crystal such that the selected operating mode of the laser is constantly selected.

Referring now to the drawings, wherein like components are designated by like reference numerals, FIG. 2 schematically illustrates a preferred embodiment 10 of an intra-cavity frequency-doubled OPS-laser in accordance with the present invention. Laser 10 includes an OPS-chip 12 mounted on a substrate or heat-sink 14. The OPS-chip includes a mirror-structure 16 surmounted by a multilayer gain-structure 18. Mirror-structure 18 and an end-mirror 20 form a laser-resonator 22.

Pump-radiation from a diode-laser bar or stack thereof (not shown) is directed onto gain-structure 18 causing fundamental-wavelength (fundamental frequency) laser-radiation to circulate in laser-resonator 22 as indicated by arrows F. A birefringent filter (BRF) provides coarse filtering for selection of the fundamental wavelength and establishes the polarization orientation of the circulating fundamental-wavelength radiation as indicated in FIG. 2 by arrows P. The fast-axis orientation of the BRF is at 45° to the polarization-orientation as indicated in the drawing.

A biaxially optically nonlinear (ONL) crystal 26 is located in resonator 22 and arranged for type-II second-harmonic (2H) frequency-conversion of the circulating fundamental radiation. Suitable crystals materials include, but are not limited to, lithium borate LBO and potassium titanyl phosphate (KTP). Crystal 26 is heated by a heating-element 28, such as a thermo-electric heating element. For the type-II 2H-conversion, the fast axis of crystal 26 is also at 45° to the polarization-orientation, also as indicated in the drawing. In this type-II arrangement crystal 26 also acts as a birefringent filter, but with a much narrower bandwidth than BRF 24. BRF 24 and crystal 26 act cooperatively as a two-element Lyot-type filter.

Transmission peak-wavelengths of the birefringent filter are dependent on the crystal-temperature. There is a range of crystal temperature over which phase-matching of the filter is effective. Within this range, crystal 26 has an acceptance bandwidth for the 2H-conversion.

When the pass-band of this two-element Lyot filter has the transmission peak at the oscillating fundamental wavelength (cavity mode) there will be essentially no radiation reflected from BRF 24, as the BRF is inclined at Brewster's angle with respect to the circulating radiation. If the wavelength of the cavity-mode drifts to a longer or shorter wavelength due to a perturbation in the resonator length there will be increasingly more reflected radiation. In laser 10, radiation reflected from BRF 24 is monitored by a detector 30 and transmitted to a controller 32. Controller 32 controls heating-element 28 adjusting the temperature of crystal 26 until the monitored reflection (error signal) from BRF 24 is at a predetermined non-zero value near the minimum. This is close enough to be considered as effectively "about the minimum", while providing a reflection slope to determine direction of the error signal. This maintains the transmission peak of the two-element Lyot filter at the wavelength of the oscillating mode. This can be described as "mode-tracking" and is discussed in detail further herein below. Preferably the differential of the detector output is sued to provide a more sensitive measure of the slope. In this way the measuring point can be taken at as low as 50 parts per million (ppm), i.e., about 0.005% of circulating power.

It should be noted here that laser 10 is depicted in a simple form, with only sufficient components to illustrate the mechanism of the present invention. In practice such an intra-cavity frequency-doubled laser may include fold mirrors for reducing the "footprint" of a long resonator and one or more concave mirrors for creating a beam waist in the optically nonlinear crystal. Several intra-cavity frequency-converted lasers are described in detail in U.S. Pat. No. 6,097,742, assigned to the assignee of the present invention, and the complete disclosure of which is hereby incorporated herein by reference. From the disclosure of the '742 patent and the description of the present invention presented herein, those skilled in the art may design other resonator arrangements including BRF reflection monitoring and cooperative temperature tuning of a type-II arranged optically nonlinear crystal for mode-tracking without departing from the spirit and scope of the present invention. Further controller 32 may have other functions such as output-power monitoring and control.

Figure 3:
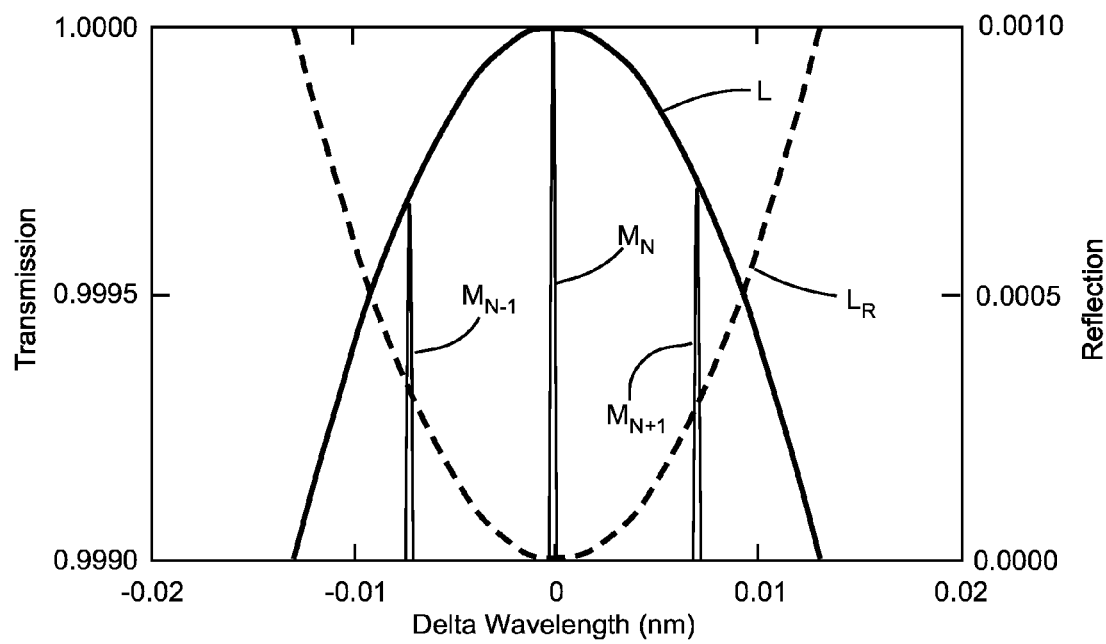
FIG. 3 is a graph schematically illustrating calculated transmission and reflection as a function of wavelength change for the combination of the birefringent filter and the optically nonlinear crystal in an example of the laser of FIG. 2.

FIG. 3 is a graph schematically illustrating calculated transmission (curve L) and corresponding reflection (dashed curve $L_R$) as a function of wavelength change for the Lyot filter combination of the birefringent filter and the optically-nonlinear crystal in an example of the laser of FIG. 2. It should be noted that curve L is essentially determined by optically nonlinear crystal 26, which has a much narrower bandwidth than that of BRF 24. It is assumed that the crystal is an LBO crystal having a length of about 7 mm.

Curve L is "temperature tuned" (delta wavelength=0) to a have peak transmission and minimum reflection for a cavity mode $M_N$. Adjacent cavity modes $M_{N+1}$ and $M_{N-1}$ at respectively longer and shorter wavelengths (lower or higher frequencies) have transmission about 0.03% less and reflection about 0.03% greater than mode $M_N$. The cavity modes are wavelength-separated by about 7 picometers (pm) corresponding to a cavity (resonator) length of about 70 mm. A wavelength difference of 7 pm corresponds to a change in resonator length of only about 7 micrometers (µm).

The transmission difference of about 0.03% between mode $M_N$ and the adjacent modes is assumed to be sufficient that mode $M_N$ will be the single oscillating mode. It is assumed that the transmission curve is fixed by holding optically nonlinear crystal 26 (see FIG. 2) at a constant temperature. Now, if a perturbation of the resonator length occurs for any reason, the cavity modes will move to shorter or longer wavelength depending whether the resonator length-change is negative or positive. If the length change is positive, the transmission for mode $M_N$ will decrease (with corresponding increase in reflection) and the transmission of mode $M_{N-1}$ will increase. As a resonator length is reached where the transmission (and reflection loss) for those two modes equalizes, the probability increases that oscillation will "hop" from mode $M_N$ to mode $M_{N-1}$.

Figure 1:
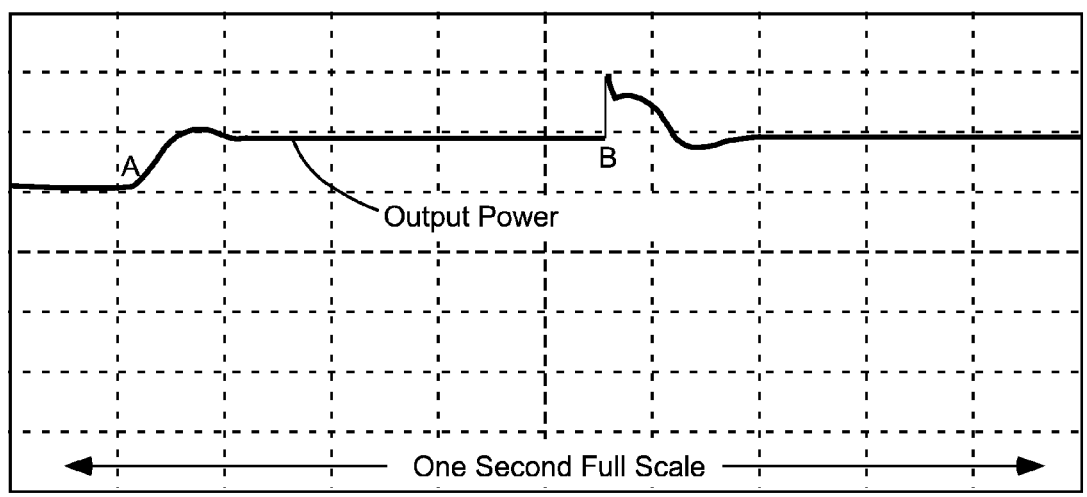
FIG. 1 is a reproduction of an oscilloscope trace of output-power of a prior art intra-cavity frequency doubled OPS laser over a time-period during which a mode-hop occurs as a result of increasing the output-power of the laser.
Figure 4:
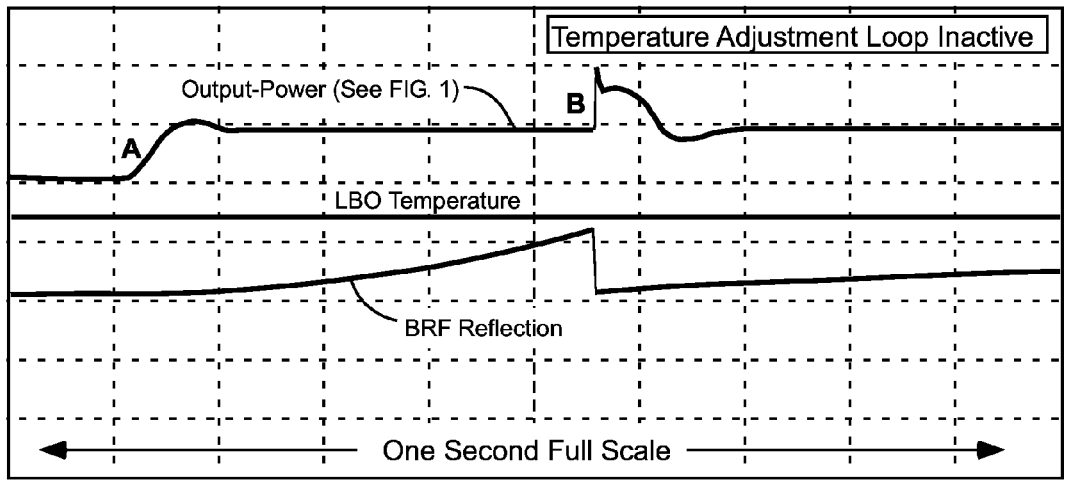
FIG. 4 is a reproduction of an oscilloscope trace of output-power, temperature of the optically nonlinear crystal, and monitored reflection from the birefringent filter in an example of the laser of FIG. 2 in which the heating element is not responsive to the monitored reflection, the crystal temperature remains constant, and a mode-hop occurs as a result of increasing the output-power of the laser.

This is illustrated in FIG. 4 for a practical example of laser 10 of FIG. 2 in which the crystal temperature control loop between measured BRF reflection and heating element 28 is inactivated and the crystal temperature is held constant. The fundamental wavelength of the laser is 1064 nm. Here, the upper curve is essentially the output-power curve of FIG. 1 which is subject to the step increase in power at point A. The middle curve is the monitored temperature of optically nonlinear crystal 26, here an LBO crystal. The lower curve is the monitored reflection from BRF 24.

It can be seen that immediately after the 20% power increase at point A, the monitored reflection begins to rise, indicating a long-wavelength drift of the cavity modes. At point B at which the mode-hop occurs, the monitored reflection falls abruptly to about the value at prior to the application of the power increase. This indicates in terms of FIG. 3 that the $M_{N-1}$ mode is at the peak transmission (minimum reflection) wavelength of the filter when the mode-hop occurs.

Figure 5:
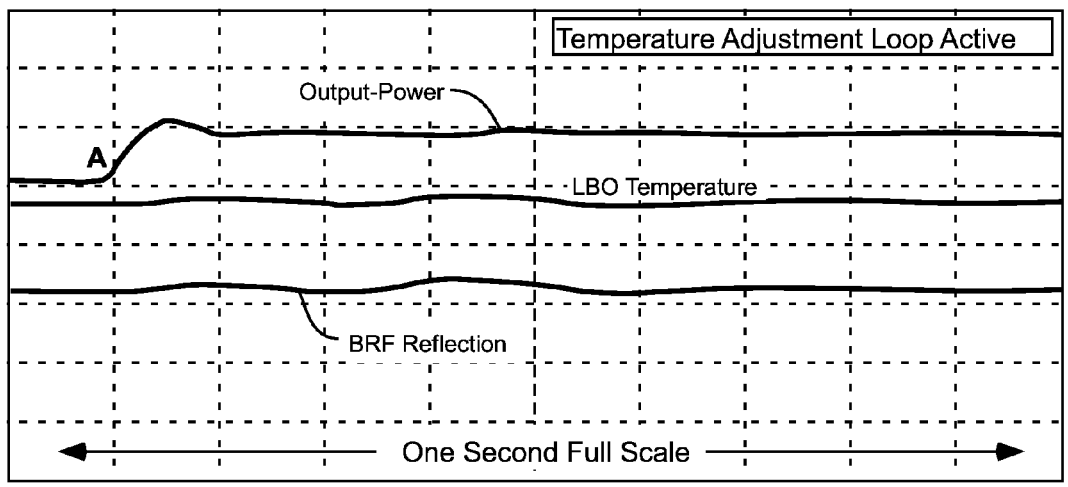
FIG. 5 is a reproduction of an oscilloscope trace of output-power, temperature of the optically nonlinear crystal, and monitored reflection from the birefringent filter in an example of the laser of FIG. 2 in which the heating element is responsive to the monitored reflection, the crystal temperature is varied according to the measured reflection and a mode-hop does not occur.

FIG. 5 shows the same monitored parameters of FIG. 4 when the inventive control loop between the monitored BRF reflection and heating element 26 is activated such that the temperature of crystal 26 is adjusted to maintain the BRF reflection at about a minimum. The 20% power increase is at point A. No mode-hop occurs at point B. It appears, within the accuracy of the reproduction, that what fluctuations in monitored BRF reflection occur are compensated by slight variations of the LBO temperature.

On superficial consideration, it may be believed that the response of the actual crystal temperature to a change in the temperature of the heating element may be relatively slow. However, in the examples of FIGS. 3, 4, and 5 a change in temperature of the crystal of only ten-thousands of a degree Kelvin (10 mK) is needed to change the peak transmission of crystal 26 by one cavity mode spacing. Practically, this change can occur within a few milliseconds, which is short enough, certainly in terms of long term resonator perturbations due to environmental factors, for the invention to function effectively. The temperature change is well within the temperature tolerance for phase-matching.

It would be possible, instead of linking crystal temperature to the monitored BFR reflection, to adjust the resonator length using a mirror driven by a piezoelectric transducer keeping the crystal temperature constant, which may be able to respond to perturbations caused by at least low-frequency vibration. This, however, is a relatively expensive option. Vibration and shock perturbations my simply be tolerated or measures taken to avoid such perturbations. Alternatively, an OPS-laser may be designed to resist vibration induced changes of resonator length. Such an arrangement is described in U.S. patent application Ser. No. 14/210,433, assigned to the assignee of the present invention and the complete disclosure of which is hereby incorporated herein by reference.

In generating the results of FIGS. 4 and 5, a simple photo-diode detector was used for monitoring the reflection from BRF 24. It would be possible to use a more precise detector arrangement such as the well-known Hänsch-Couillaud arrangement. This provides an error-signal with zero-crossing at the minimum, and with a positive or negative sign indicative of whether the signal is above or below the minimum. This requires additional optical components and an additional detector, at corresponding cost and complexity. It is not clear, however, that this would result in any more reliable operation of the present invention.

In summary, the present invention is described above in terms of a preferred and other embodiments. The invention, however, is not limited to the embodiments described and depicted herein. Rather the invention is limited only by the claims appended hereto.

What is claimed is:

1. Laser apparatus, comprising:
a laser resonator including a multilayer semiconductor gain-structure, the gain-structure being energized by optical pump radiation, thereby causing fundamental-frequency radiation to circulate in the laser resonator, the fundamental frequency being one of a range of possible oscillating frequencies dependent on an instant length of the laser-resonator;
an optically nonlinear crystal located in the laser-resonator and arranged for type-II frequency doubling of the circulating fundamental-frequency radiation, the optically nonlinear crystal having an acceptance bandwidth in a predetermined temperature range;
a heating element arranged to selectively vary a temperature of the crystal within the predetermined temperature range;
a first birefringent filter located in the laser resonator, configured and arranged to restrict the range of possible fundamental frequencies that can oscillate within a gain-bandwidth to a range thereof within the acceptance bandwidth of the optically nonlinear crystal and wherein the optically nonlinear crystal functions as a second birefringent filter having a transmission peak dependent on the crystal temperature;
a detector arranged to monitor fundamental-frequency radiation reflected from the first birefringent filter, the reflected radiation being at a minimum when a transmission peak of the second birefringent filter is at an instant one of the possible oscillating frequencies; and
a controller for receiving error signals from the detector and controlling the heating element in response thereto in manner to maintain the monitored reflection at about a minimum, thereby maintaining the transmission peak of the second birefringent filter at about the instant oscillating frequency.

2. The apparatus of claim 1, wherein the monitored reflection is maintained at a non-zero value to provide a slope for determining the direction of the error signal.

3. The apparatus of claim 2, wherein the monitored reflection is at a value of about 50 parts per million of circulating fundamental-frequency radiation power.

4. The apparatus of claim 1, wherein the laser resonator has a length of about 70 mm and the possible oscillating wavelengths are separated by about 7 picometers.

5. The apparatus of claim 1, wherein the optically nonlinear crystal is a lithium borate crystal.

6. A method of operating a laser apparatus, said laser having a laser resonator including a multilayer semiconductor gain-structure that is energized by optical pump radiation thereby causing fundamental-frequency radiation to circulate in the laser resonator, said laser resonator including an optically nonlinear crystal arranged for type-II frequency doubling of the circulating fundamental-frequency radiation, said laser resonator further including a birefringent filter, said method comprising:

monitoring an intensity of the fundamental-frequency radiation reflected from the birefringent filter and generating an error signal; and adjusting a temperature of the nonlinear crystal based on the error signal to minimize mode-hopping.

7. A method as recited in claim 6, wherein the temperature of the nonlinear crystal is adjusted in a manner to maintain the monitored intensity at a non-zero value to provide a slope for determining the direction of the error signal.

* * * * *